United States Patent [19]

Shumway et al.

[11] 4,234,863

[45] Nov. 18, 1980

[54] INDUCTIVE PICKUP CLIP

[75] Inventors: DeWayne J. Shumway, Fruita; Delbert D. Gennetten, Grand Junction, both of Colo.

[73] Assignee: Dixson, Inc., Grand Junction, Colo.

[21] Appl. No.: 958,748

[22] Filed: Nov. 8, 1978

[51] Int. Cl.³ ...................... H01F 27/02; H01F 40/06
[52] U.S. Cl. ..................................... 336/90; 324/127; 336/176
[58] Field of Search ................... 336/175, 176, 90, 92; 324/127, 149, 117 R, 117 H, 129; D10/79; 335/193, 46, 104, 248, 271, 277, 257

[56] References Cited

U.S. PATENT DOCUMENTS

| D. 203,181 | 12/1965 | Koch | D10/79 |
|---|---|---|---|
| D. 242,991 | 1/1977 | McKenzie et al. | D10/79 |
| 3,213,365 | 10/1965 | Wilson | 324/119 |
| 3,475,682 | 10/1969 | Peek et al. | 324/127 |
| 3,706,032 | 12/1972 | Vikstrom | 324/127 |
| 3,708,749 | 1/1973 | Bateman et al. | 324/127 |
| 4,005,380 | 1/1977 | Heilmann et al. | 336/176 X |

FOREIGN PATENT DOCUMENTS 1364817  8/1974  United Kingdom ..................... 324/127

Primary Examiner—Thomas J. Kozma

Attorney, Agent, or Firm—Gregory W. Moravan; Roy E. Mattern, Jr.; David H. Deits

[57] ABSTRACT

An inductive pickup clip comprising two telescoping body portions between which is compressed a main body spring and within which are mounted respective core portions. When the clip is closed, said core portions define an opening adapted to receive therethrough an electric wire during use. The end portions of at least one core portion are spring loaded to prevent chipping or breakage of the core portions and to insure correct alignment of the cores when the clip is closed. A bi-stable latching mechanism is employed which, when latched, holds the clip closed, and when unlatched, permits the spring loaded telescoping body portions to assume an open configuration under the urging of the main body spring therebetween. Such a latching mechanism insures that when the slip is closed about the electric wire to be monitored, the user must close it against the force of the main body spring, thereby further preventing chipping or breakage of the core portions. Said telescoping body portions also include complementary guides which insure that when said telescoping body portions are urged together by the user, they will be brought together in a direction which will help to insure a snug fit and correct alignment therebetween, and which will help to prevent damage to the core portions.

14 Claims, 8 Drawing Figures

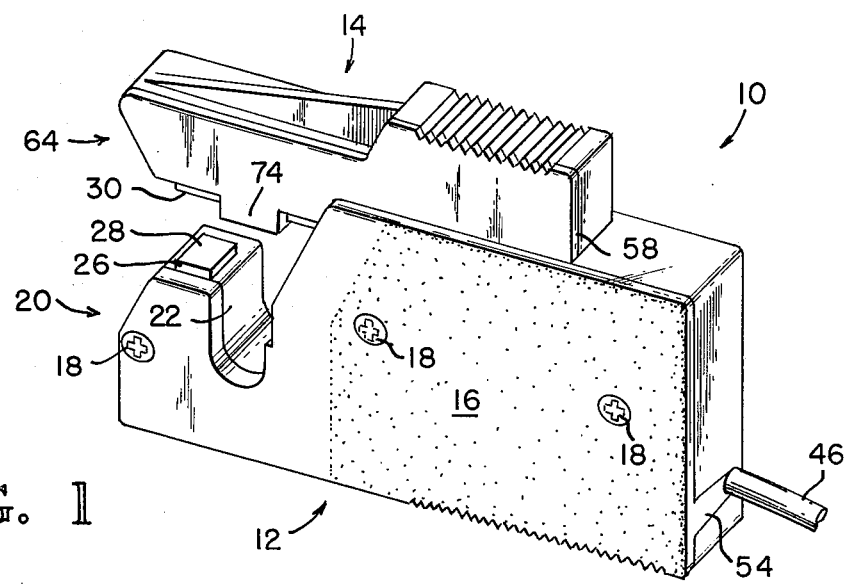
FIG. 1
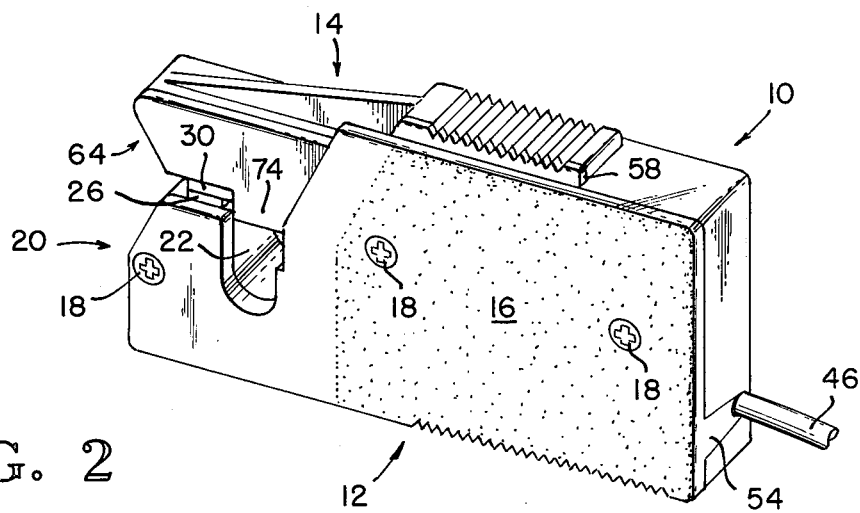
FIG. 2
FIG. 4
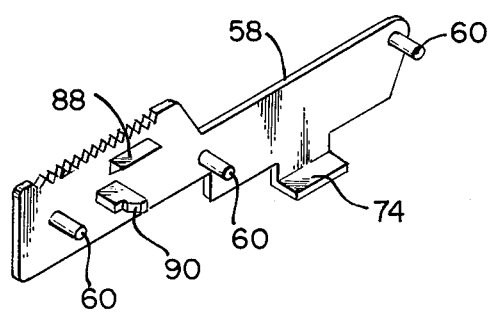

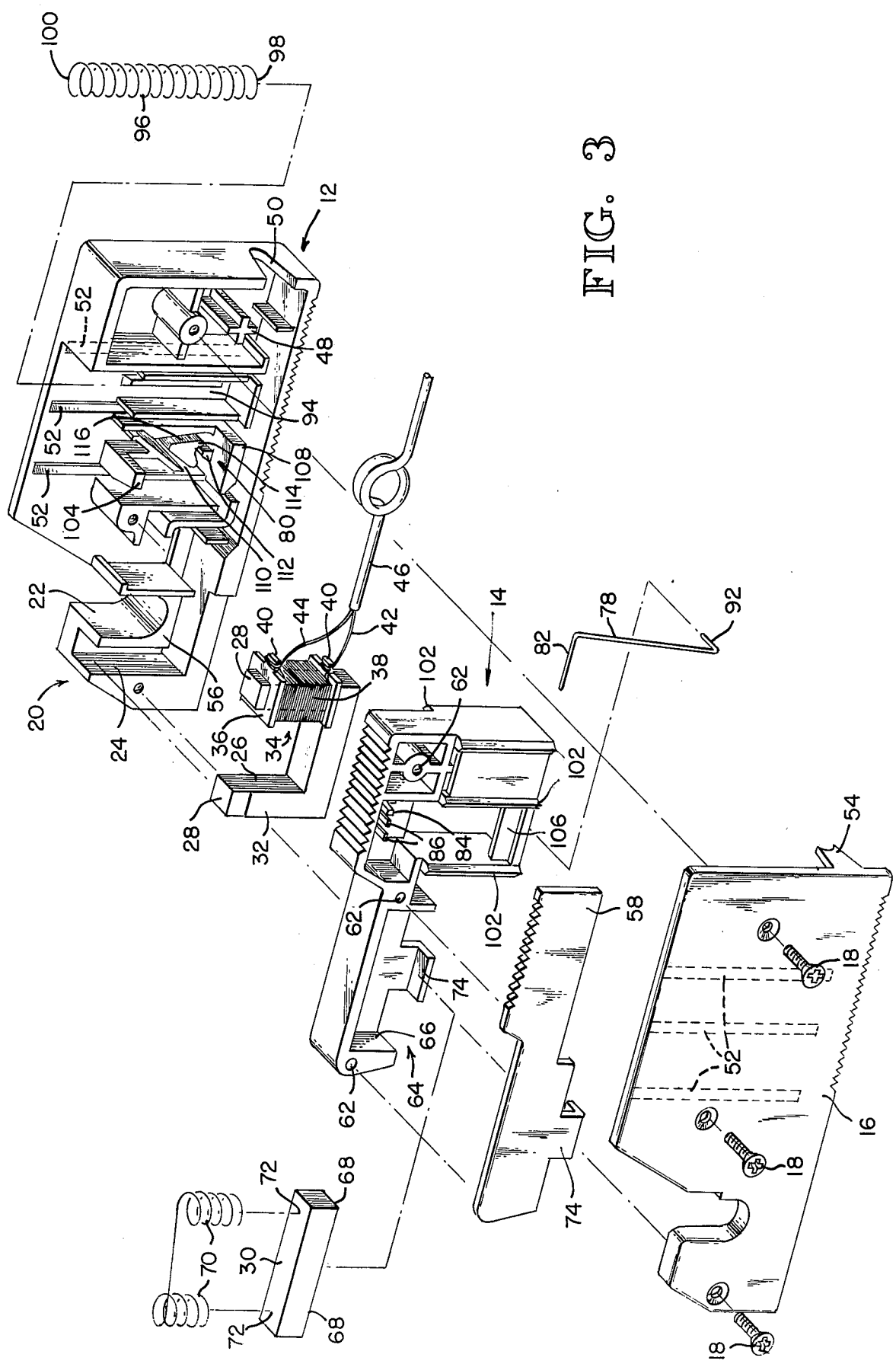

INDUCTIVE PICKUP CLIP

BACKGROUND OF THE INVENTION

1. Field of the Invention

This invention relates to inductive pickup clips, and more particularly to an inductive pickup clip whose ferrite core portions are extremely resistant to breakage due to the spring loading thereof and the manner in which the clip is closed by the user, as will be more particularly described hereinafter.

2. Description of the Prior Art

As is well known to those skilled in the art, the ferrite cores which are typically found in inductive pickup clips are extremely fragile, and thus susceptible to chipping and/or breakage during use. One common design for an inductive pickup clip is disclosed in U.S. Pat. No. 4,005,380 granted Jan. 25, 1977, to Heilmann et al. The Heilmann clip is generally of the configuration of a clothespin and comprises two members hinged together in the middle, the jaw ends of which are maintained normally closed by a spring under tension. Within the jaws of the device are mounted ferrite core halves which are brought into contact under the urging of said spring when the handle portions of the members are released. Such a device is normally susceptible to breakage of the ferrite cores since if the handles are squeezed together and then suddenly released the spring urges the jaws violently together, thereby chipping or breaking the cores. The Heilmann device attempts to solve this breakage problem by first mounting each core portion in a plastic support and then spring loading each plastic support/core portion assembly within its respective jaw.

The Heilmann device is unduly complex and costly due to the necessity for a separate plastic support for each core portion. In addition, this device is inconvenient and possibly dangerous to use since its handles may entangle other wires in the vicinity during use. This device is also inconvenient to use for the reason that the jaws must be held manually open with the handles against the tension of the spring which normally urges the jaws together, until the device can be clamped on the desired wire.

Another approach is taken by U.S. Pat. No. 3,475,682, granted Oct. 28, 1969 to Peek et al. In this device, one core portion is carried by a telescoping body portion. Although the core portions in the Peek device are unlikely to break during use, due to the fact that the core portions are aligned by longitudinally extending one core portion, it is possible that an undesirable air gap will exist between the core portions when they are aligned or that they will scratch or mar each other as they slide over one another, thereby rendering it likely that the device will have a reduced sensitivity and reliability.

SUMMARY OF THE INVENTION

One of the primary objects of the present invention is to provide a simplified, long life inductive pickup clip in which it is very unlikely or even impossible that the relatively fragile ferrite core portions utilized therein will chip or break during use. In order to achieve this object, some aspects of the present invention specify that the end portions of at least one core portion are spring loaded so that when the core portions are brought together into a closed configuration by the user, the spring loaded core portion will yield, thereby greatly reducing the possibility that the core portions will chip or break when being brought together into contact.

The foregoing object is also at least partially achieved by other aspects of the present invention which specify that the core portions, which are mounted in respective body portions of the inductive pickup clip, are normally held in an open configuration by a body spring under compression. Thus, when the body portions, and hence the core portions, are brought together by the user, the speed at which they are brought together is relatively slow since the body portions must be urged together against the compression of the body spring. In addition, since the gripping force which the ordinary user can exert in order to close the body portions is relatively small, this fact further insures that the core portions will not be brought violently together, thereby significantly reducing the chance that the core portions could chip or break while being brought into a closed configuration.

Another primary object of the present invention is to provide an inductive pickup clip which is unusually convenient to use. This object is achieved by certain aspects of the present invention which specify that the body members which carry the core portions are telescopically movable with respect to each other. In addition, a bistable latching mechanism is provided having a first, latched position for holding said body portions, and hence said core portions, in a closed configuration; and a second, unlatched position, which permits the body portions, and hence said core portions, to assume and maintain an open configuration under the urging of the body spring which is held under compression between the body portions. Thus, unlike some prior art devices, when the bistable latching mechanism is unlatched, the jaws of the inductive pickup clip are automatically opened and remain opened until the user clamps the inductive pickup clip about the desired wire.

In addition, since the body members are specified to be telescopically movable, the inductive pickup clip of the present invention has no projections which might entangle other wires which may be present in the vicinity of use.

A further object of the present invention is to provide an inductive pickup clip which reduces to an absolute minimum the possibility of an air gap existing between the core portions when they are brought together, and which further insures correct alignment of the core portions when they are brought together. This object is achieved by those aspects of the present invention described above, in which spring loading of at least one core portion is provided. As will be readily appreciated, such spring loading insures as intimate contact between the core portions, thereby reducing any air gap to a negligible amount.

A further object of the present invention is to provide an inductive pickup clip having guide means on the body portions which insure that when the body portions, and hence the core portions, are telescopically moved together, one body portion will move along a straight line which extends radially outwardly from the center of the figure defined by the core portions when they are in a closed configuration. Alternatively, the guide means on the body portion may be so arranged such that when the body portions, and hence the core portions they carry, are telescopically moved together, one core portion will move along a straight line which is at least at an acute angle, and which may be generally perpendicular, with respect to the end faces of the other core portion. Such a relative movement between the core portions helps to prevent chipping and breaking of the core portions when they are moved into a closed configuration, as well as helping to reduce the possibility that an air gap may exist between the core portions when they are moved to a closed configuration.

Another object of the present invention is to provide an inductive pickup clip in which the core portions are completely insulated from any possible physical or electrical contact with the electric wire which is being monitored by the clip. This object is at least partially achieved by certain aspects of the present invention which specify that the retainer which secures at least one of the core portions to its respective body portion also acts to insulate the core portion from contact with the electric wire being monitored.

Further objects of the present invention are to provide a relatively inexpensive, simple, easy to mass produce and assemble, yet highly durable inductive pickup clip.

These and further objects, features, advantages and characteristics of the inductive pickup clip of the present invention will be apparent from the following more detailed description of the preferred embodiments.

BRIEF DESCRIPTION OF THE DRAWINGS

FIG. 1 is a perspective view from the top, rear, left side of the inductive pickup clip of the present invention showing it in an open configuration;

FIG. 2 is a view like that in FIG. 1, showing the present invention in a closed configuration;

FIG. 3 is an exploded isometric view of the present invention;

FIG. 4 is an isometric view of the interior side of the cover for the movable body of the present invention;

DESCRIPTION OF THE PREFERRED EMBODIMENTS

Figure 5:
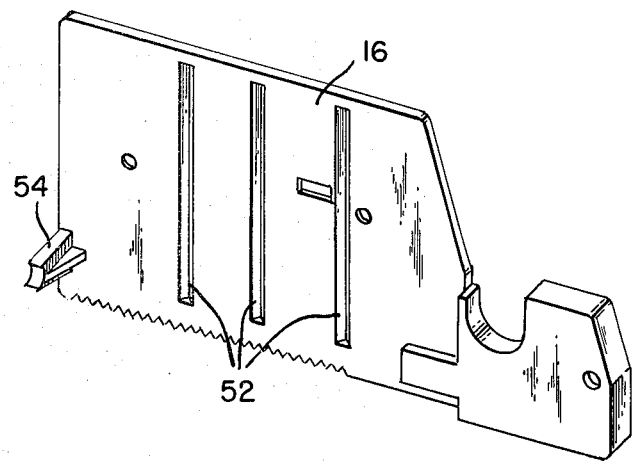
FIG. 5 is an isometric view of the interior side of the cover for the main body of the present invention.
Figure 6:
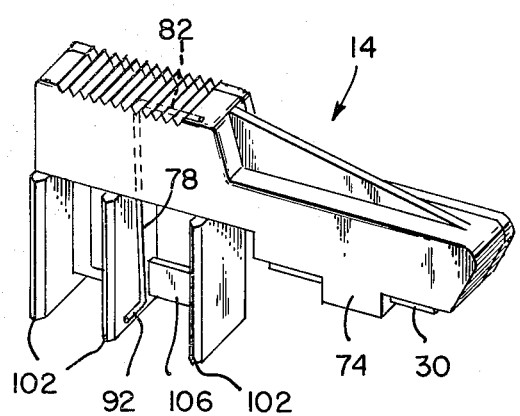
FIG. 6 is an isometric view of the reverse side of the movable body of the present invention.

It should be understood that the inductive pickup clip of the present invention, although designed to be utilized primarily with automotive timing lights, could be used with other associated electronic equipment whenever it is desired to detect current changes in an electrical conductor. By way of non-limiting example, the inductive pickup clip of the present invention may be used with a model 418 timing light manufactured by Dixson, Inc. of Grand Junction, Colorado.

Turning now to the figures, the inductive pickup clip of the present invention is seen generally designated as 10. The inductive pickup clip has two main assemblies, a main body portion 12, and a movable body portion 14 which is telescopically movable with respect to the main body portion, as will be described in detail below. The main body portion has a removable cover 16 which is secured thereto by three screws 18. The jaw end 20 of the main body defines an opening 22 through which the current carrying wire being monitored (not shown) is located during use. As best seen in FIG. 3, the jaw end 20 of the main body also defines a recess 24 into which a U-shaped ferrite core portion 26 is seated with a friction fit.

The main body 12 and its cover 16 may be injection molded by conventional techniques from any suitable impact resistant, durable plastic such as ABS (acrylonitrile butadiene styrene), such as T grade ABS plastic manufactured by Uniroyal, Inc. of New York, New York.

The ferrite U-core portion 26 may be formed by conventional sintering processes from any suitable ferrite material such as Ceramag 24 manufactured by Stackpole Carbon Company of St. Mary's, Pennsylvania. The end faces 28 of the U-core portion 26 should be flat to within 0.0005 inches to insure little or no air gap will exist between the U-core portion in the main body and the I-shaped core portion 10 in the movable body 14 when they are brought into a closed configuration. An air gap between the core portions would significantly impair the sensitivity and reliability of the inductive pickup clip. Chipping and breakage resistance of the U-core portion 26 can be enhanced by applying a layer of vinyl electrical tape 32 to the outer surfaces thereof, as seen. Although it is preferred that the core portions 26, 30 be formed from ferrite because of low cost and ease of insuring flat end faces, laminated soft iron core portions 26, 30 could be used.

Positioned about one arm of the U-core portion 26 is an inductive pickup coil 34 comprising a nylon bobbin 36 about which are wound about 25 turns of any suitable insulated 26 gauge magnet wire 38. To the terminals 40 of the coil are soldered the center conductor 42 and outer shield 44 of a coaxial cable 46. The other end of the coaxial cable 46 may be connected to any suitable electric apparatus such as the timing light previously mentioned. In order to prevent the coaxial cable from being tugged out of the main body 12, it is looped about a ribbed boss 48 within the main body before its exit therefrom through a slot 50.

Both the main body 12 and its cover 16 each have three elongated guide channels 52 whose function will be described subsequently. The cover 16 also includes a cable stop projection 54 which, when the cover is assembled to the main body, extends into the cable slot 50 and helps to secure the cable 46 in place.

The jaw end 20 of the main body also includes a retainer 56 for the U-core portion 26. The retainer 56 serves not only to retain the U-core portion within the main body but also serves to insulate the U-core portion from undesirable physical or electrical contact with the electric wire being monitored. Such an insulating function is important since, if the inductive pickup clip 10 of the present invention is used to sense current changes in a spark plug wire, for example, the high voltage in the wire may otherwise tend to be conducted to and adversely affect the U-core portion 26, the coil 34, and any electronic apparatus connected to the coaxial cable 46 should the insulation on the wire be cracked, pitted, or old.

Turning now to the movable body portion 14, we see that it has a cover 58 which is secured thereto by three pins 60, best seen in FIG. 4, which engage complementary holes 62 in the movable body with a snug friction fit. The movable body 14 and its cover 58 can be injection molded from ABS plastic, as was previously described. In the jaw end 64 of the movable body is a rectangular recess 66 within which is located an I-shaped ferrite core portion 30 also made from Ceramag ferrite material as was previously described. The end faces 68 of the I-core portion 30 are also flat to within about 0.0005 inches, for the reasons previously described with respect to the U-core portion 26.

Sandwiched between the I-core 30 and the jaw end 64 of the movable body 14 are a pair of springs 70 made from one piece of 12 gauge steel music wire, which is preferably finished with cadmium or nickle plate for corrosion resistance. It should be noted that although two separate springs 70 could be used, it is preferred that both springs 70 be formed from one piece of wire since, as will be readily appreciated, the spacing between the springs is automatically insured. Thus, the springs 70 will load only the end portions 72 of the I-core portion 30. If the I-core 30 was supported only in the center by a single spring, breakage of the I-core 30 could occur as its end portions are loaded when the clip 10 is brought into a closed configuration.

The I-core 30 and the springs 70 are retained within the recess 66 by a pair of retainers 74 which are part of the jaw portions of the movable body 14 and its cover 16. The retainers 74 also serve the important function of acting to insulate the I-core 30 from physical or electrical contact with the wire which is being monitored, in the same fashion as was previously discussed with respect to the retainer 56 in the jaw portion of the main body 12.

Interconnecting the main body 12 and the movable body 14 is a bi-stable latching mechanism 76 comprising a latching arm 78 carried by the movable body and a tortuous loop path 80 molded in the main body. One end 82 of the latching arm is retained in the movable body by a retaining recess 84 and by a pair of retaining arms 86. A retaining bar 88 and a retaining arm 90, best seen in FIG. 4, project from the inside of the movable body's cover 58 and interlock with the retaining arms 86 in the movable body 14 and the latching arm 78 so that when the cover 58 and the movable body 14 are assembled together one end 82 of the latching arm is securely retained in the movable body and will not rotate.

The other end 92 of the latching arm 78 is bent at right angles with respect to its secured end 82, and rides in the tortuous loop path 80 molded in the main body.

Located in a spring recess 94 in the main body is a main body compression spring 96 having its lower end 98 acting against the main body 12 while its upper end 100 acts against the movable body 14. Six guide projections 102 on the movable body ride in respective guide channels 52 located in the main body and in its cover 16. A stop projection 104 in the main body coacts with a stop bar 106 carried by the movable body and serves to prevent the main spring 96 from ejecting the movable body 14 from the main body 12 when the bi-stable latching mechanism 76 is unlatched. The stop bar 106 on the movable body also coacts with a stop bar 108 on the main body to limit the downward travel of the movable body within the main body.

Figure 7:
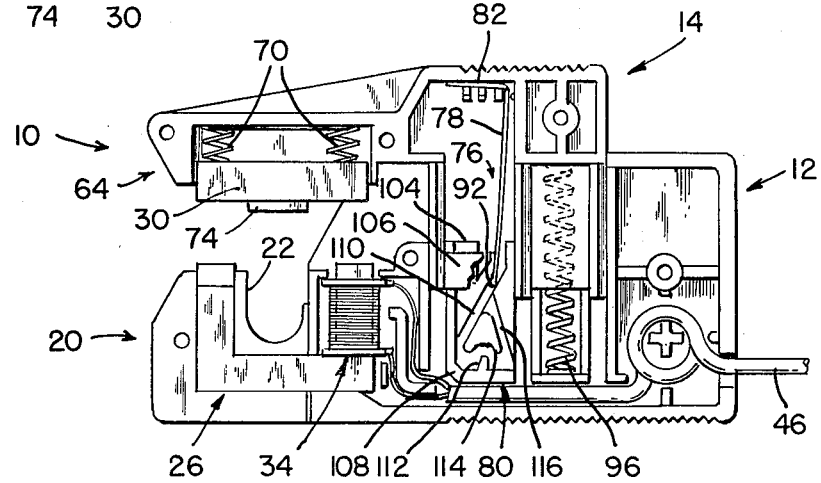
FIG. 7 is a side elevational view of the present invention with its covers off and with certain parts broken away for clarity, showing the invention in an open configuration.

The mechanical operation of the inductive pickup clip 10 of the present invention will now be described. Referring now to FIG. 7, the inductive pickup clip is shown in its open configuration with the stop projection 104 on the main body 12 coacting with the stop bar 106 on the movable body 14 to prevent the ejection of the movable body from the main body, as was previously described. As seen, the lower end 92 of the latching arm is resting in the top portion of the tortuous loop path 80 in the main body. The wire to be monitored is then placed in the opening 22 in the jaw end 20 of the main body. As the movable body is telescopically moved down in the guide channels 52 in the main body and in the main body's cover 16, the main compression spring 96 is being compressed. At the same time, the lower end 92 of the latching arm 78 is sliding down the left channel 110 of the tortuous loop path 80. It is noted that the left channel 110 is at an angle with respect to the direction of movement of the movable body 14 so that as the lower end 92 of the latching arm moves downwardly it is being placed in tension. Just before the movable body's stop bar 106 bottoms against the stop bar 108 of the main body, the shape of the tortuous loop path changes and allows the end of the latching arm to snap against an upwardly projecting rib 112, relieving some of the tension in the latching arm 78. As the movable body is further forced down until its stop bar 106 bottoms against the stop bar 108 in the main body, the lower end 92 of the latching arm stays against the rib 112.

Figure 8:
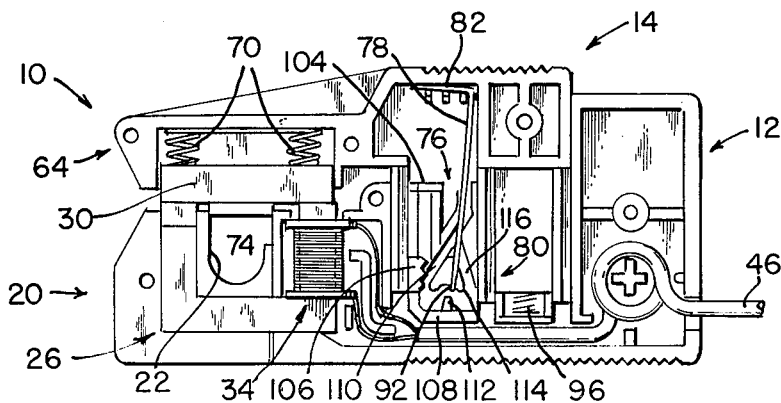
FIG. 8 is a view similar to that shown in FIG. 7 except that the invention is shown in a closed configuration.

When the force to move the movable body 14 downwardly is released, the main compression spring 96 exerts a force to begin to return the movable body to its original position; however the lower end 92 of the latching arm is still in tension against the rib 112 and, as the movable body moves upwardly, the lower end of the latching arm snaps past the rib and comes to rest against a projection 114 in the tortuous loop path, as best seen in FIG. 8. This locks the movable body and prevents it from traveling further upwardly.

At this point, the core portions, 30, 26 in the movable body 14 and in the main body 12, respectively, are aligned and in firm contact with each other. As seen in FIG. 8, the pair of springs 70 acting against the I-core 30 in the movable body have been somewhat compressed thereby insuring the firm contact between the core portions. It should be noted that the springs 70 have also absorbed much of the impact as the core portions 26, 30 are brought together, thereby preventing chipping or breakage of the same, and also serving to automatically correct any misalignment between them. Such chipping or breakage of the core portions 26, 30 is also significantly reduced by the fact that the user must act against the force of the main compression spring 96 as the core portions are brought into contact.

To cause the movable body 14 to return from the closed configuration to its original, open configuration, the movable body is again forced downwardly. As it moves downwardly, the lower end 92 of the latching arm, which is still in tension, snaps past the projection 114 in the tortuous loop path and into the right channel 116 of the tortuous loop path, which gradually decreases in depth toward its point of intersection with the left channel 110.

As the movable body 14 continues to move upwardly under the urging of the main compression spring 96, the lower end 92 of the latching arm travels upwardly in the right channel 116 towards the intersection of the left and right channels until, at a predetermined point, the lower end of the latching arm snaps into the left channel 110 and continues to move upwardly in the left channel until the stop bar 106 on the movable body encounters the stop projection 104 on the main body, thereby preventing further upward movement of the movable body.

It should be noted that the gradual decrease in depth of the right channel 116 as it approaches its intersection with the left channel 110, as well as the tension on the lower end 92 of the latching arm while it is in tortuous loop path 80, insure that the lower end of the latching arm will travel through the loop path only in a clockwise direction. Thus, by a simple push-push action on the movable body, the complete cycle of closing and opening the inductive pickup clip is accomplished.

The electrical operation of the inductive pickup clip will now be described. When the inductive pickup clip is in its closed configuration around the wire to be monitored, such as a spark plug wire, the core portions 26, 30 are held firmly against each other by the springs 70 which load the end portions 72 of the I-core 30 in the movable body. When the spark plug is fired, a magnetic flux field is developed around it and is concentrated in the ferrite core portions 26, 30. Upon completion of the spark plug fire, the magnetic flux lines around the spark plug wire collapse and cut across the magnet wire 38 wound on the bobbin 26 and create an electrical pulse which is fed through the coaxial cable 46 to any desired form of electronic apparatus, such as a timing light, for example.

It should be understood from the foregoing that one of the important features of the present invention is that the body portions 12, 14 and hence the core portions 26, 30, are movable in a vertical direction directly towards and directly away from each other, as is clearly illustrated in FIGS. 1, 2, 7 and 8. That is, for example, when the body portions are telescopically moved between open and closed configurations as shown, one core portion 30, for example, moves along a straight line extending radially outwardly from the center of the figure defined by said core portions 26, 30 when they are in a closed configuration. Such a relative motion between the core portions helps to reduce chipping or breakage of the same when being urged into a closed configuration against the action of the main body spring 96. Such a relative motion also helps to insure correct alignment of the core portions and to reduce any air gap therebetween, to a negligible amount when they are in a closed configuration.

However, the scope of the present invention is broad enough to encompass relative movement between the core portions 26, 30 which is other than in a strict vertical direction directly toward or away from each other. For example, the molding of the guide channels 52 and projections 102 at an angle with respect to their orientation presently shown in FIG. 3, would produce such a relative motion which is not in a strict vertical direction. So some aspects of the present invention may include relative motions between the core portions 26, 30 such that when the body portions 12, 14 are telescopically moved between open and closed configurations, one core portion 30, for example, will move along a straight line such as described in the preceding paragraph or along a straight line which is at least at an acute angle or which may be generally perpendicular with the end faces 28 of the other core portion.

From the foregoing, it is seen that the motion of the core portions 26, 30 of the present invention is clearly distinguishable from that of previously discussed U.S. Pat. Nos. 4,005,380 and 3,475,682 in which the core portions move arcuately towards each other about a hinge (the U.S. Pat. No. 4,005,380) and in which one core portion moves towards the other with a sliding, horizontal motion which may abrade or scratch the contact surfaces of the core portions, resulting in an undesirable air gap therebetween (the U.S. Pat. No. 3,475,682).

From the foregoing, various further applications, modifications, and adaptations of the apparatus disclosed by the foregoing preferred embodiments of the present invention will be apparent to those skilled in the art to which it is addressed, within the scope of the following claims.

What is claimed is:

1. An inductive pickup clip for generating an output signal in response to changes in the flow of electric current in an electric conductor about which said clip is adapted to be removably secured, wherein said clip is of the type including:

first and second body portions having first and second core portions secured thereto respectively, wherein said first body portion is held telescopically within said second body portion; and a pickup coil means positioned about one of said core portions and having terminals adapted to be connected to an electrical circuit;

wherein said body portions, and hence said core portions, are telescopically selectively movable with respect to each other between an open configuration and a closed configuration in which said core portions fit together to define an opening adapted to receive said electric conductor during use, and wherein the improvement comprises: shock absorbing means located only at the end portions of at least one of said core portions and being secured between said at least one of said core portions and its respective body portion for cushioning said at least one core portion as said core portions are moved into contact with each other in said closed configuration, to prevent chipping or breaking of said core portions and to insure a close fit and correct alignment between said core portions when in said closed configuration.

2. The inductive pickup clip according to claim 1, wherein said shock absorbing means comprises a pair of interconnected springs spaced apart a distance approximately equal to the distance between the end portions of said at least one core portion, to insure said springs will always load its said end portions, and not its central portion, thereby eliminating the need for a separate support for said at least one core portion while still providing shock absorbing support for the ends of said at least one core portion.

3. The inductive pickup clip according to claim 2, wherein said shock absorbing means comprises at least one length of wire having a substantially straight middle spacing segment and being wound to form a spring at each of its ends, wherein the length of said straight segment is selected to space apart the springs it forms at each of its ends a distance about equal to the distance between said end portions of said at least one core portion, to ensure said springs will always load said end portions of said core portions.

4. The inductive pickup clip according to claim 1, wherein only one of said core portions has said shock absorbing means, and the core portion which does not carries said pickup coil means.

5. An inductive pickup clip for generating an output signal in response to changes in the flow of electric current in an electric conductor about which said clip is adapted to be removably secured, wherein said clip is of the type including:

first and second body portions having first and second core portions secured thereto respectively;

a pickup coil means positioned about one of said core portions and having terminals adapted to be connected to an electrical circuit; and spring means connected between said body portions;

wherein said body portions, and hence said core portions, are telescopically selectively movable with respect to each other between an open configuration and a closed, working configuration in which said core portions fit together to define an opening adapted to receive said electric conductor during use; and wherein the improvement comprises:

said spring means being arranged to urge said body portions towards said open configuration, meaning the user of said clip must work against the urging of said spring means to force said body portions from said open configuration into said closed, working configuration.

6. The inductive pickup clip according to claims 1 or 5, wherein at least one of said core portions is retained within its respective body portion by a retainer secured to said respective body portion, said retainer being so located to also insulate said at least one core portion from said electric wire which may pass through said opening defined by said core portions when they are in said closed configuration.

7. The inductive pickup clip according to claims 1 or 5, wherein said spring means is a spring under compression loading which normally tends to urge said body portions to maintain said open configuration and wherein the user must force said body portions from said open configuration into said closed configuration against the urging of said spring.

8. The inductive pickup clip according to claims 1 or 5, wherein said first body portion defines a first cavity within which said spring is located, and wherein one end of said spring pushes against an interior portion of said first body portion.

9. The inductive pickup clip according to claims 1 or 5, wherein said second body portion defines a plurality of alignment channels and said first body portion defines a plurality of alignment ribs received by said channels and wherein none of said alignment ribs protrude from said second body portion, in order to provide a pickup clip less likely to entangle with the wiring it may be used near.

10. The inductive pickup clip according to claims 1 or 5, wherein that portion of said first body portion which carries said first core portion is located substantially exteriorly of said second body portion.

11. The inductive pickup clip according to claims 1 or 5, wherein said pickup clip further comprises latch means to releaseably hold said body portions in said closed, working configuration despite the urging of said spring means.

12. The inductive pickup clip according to claim 11, wherein said latch means comprises a bi-stable latching mechanism means which automatically engages when said body portions are squeezed together into said closed configuration and which automatically disengages when said body portions are squeezed together still further and then released.

13. The inductive pickup clip according to claim 12, wherein said bi-stable latching mechanism comprises a latching arm secured to and carried by said first body portion and further comprises a tortuous loop path carried by said second body portion, wherein one end of said latching arm travels in said tortuous loop path and the whole latching arm is located within said second body means.

14. The inductive pickup clip according to claim 6, wherein each of said body portions includes a retainer portion, the retainer portion for said first body portion being flat and elongated and the retainer portion for said second body portion being generally u-shaped, both retainer portions extending outwardly from one sidewall of its respective body portion, and wherein when said pickup clip is in said closed configuration said retainer portions define an insulated hole adapted to receive said wire during use of said pickup clip.

* * * * *